United States Patent
LaPlante et al.

(10) Patent No.: US 7,510,619 B2
(45) Date of Patent: Mar. 31, 2009

(54) GREENSHEET VIA REPAIR/FILL TOOL

(75) Inventors: Mark J. LaPlante, Montgomery, NY (US); Thomas Weiss, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 541 days.

(21) Appl. No.: 11/160,786

(22) Filed: Jul. 8, 2005

(65) Prior Publication Data

US 2007/0006695 A1    Jan. 11, 2007

(51) Int. Cl.
*B32B 15/00*    (2006.01)
(52) U.S. Cl. .................. 156/261; 156/89.12; 156/89.21; 83/13
(58) Field of Classification Search .................. 156/261
See application file for complete search history.

(56) References Cited

U.S. PATENT DOCUMENTS

| | | | |
|---|---|---|---|
| 3,768,144 A * | 10/1973 | Heinss | 29/432 |
| 4,539,058 A * | 9/1985 | Burgess et al. | 156/250 |
| 5,305,523 A | 4/1994 | Bross et al. | |
| 6,200,400 B1 * | 3/2001 | Farooq et al. | 156/89.16 |
| 6,402,866 B1 | 6/2002 | Casey et al. | |
| 6,569,278 B1 | 5/2003 | Gabriels et al. | |
| 7,243,424 B2 * | 7/2007 | Hatanaka et al. | 29/852 |

FOREIGN PATENT DOCUMENTS

| | | | |
|---|---|---|---|
| JP | 5-69394 | * | 3/1993 |
| JP | 5-129777 | * | 5/1993 |
| JP | 7-221446 | * | 8/1995 |
| JP | 8-236931 | * | 9/1996 |

OTHER PUBLICATIONS

"Filling Vias in Ceramic Green sheets" IBM Technical Disclosure Bulletin, Jan. 1990, vol. 32, Issue No. 8B, pp. 43-44.*
Transfer Personalization IBM Technical Disclosure Bulletin, May 1978, vol. 20, Issue No. 12, pp. 5234-5235.*

* cited by examiner

*Primary Examiner*—Philip C Tucker
*Assistant Examiner*—Kimberly K McClelland
(74) *Attorney, Agent, or Firm*—DeLio & Peterson, LLC; John J. Tomaszewski; Wenjie Li

(57) ABSTRACT

A method and apparatus are provided for filling vias in a product greensheet and/or repairing vias in a product greensheet. The method and apparatus utilize a transfer greensheet having filled vias in a fixed array, which vias are punched into the product greensheet to either repair or fill the via of the product greensheet. The method and apparatus employ position determining means such as a camera, a punch head and a corresponding punch die and an activating means to activate the punch head to punch the transfer greensheet via to fill the product greensheet via. The transfer greensheet has a fixed array of filled vias and a transfer greensheet station employs a fixed plate having a plurality of vacuum ports positioned in the non-via areas of the transfer greensheet which secures the transfer greensheet during the method. The product greensheet is held by a vacuum plate.

4 Claims, 9 Drawing Sheets

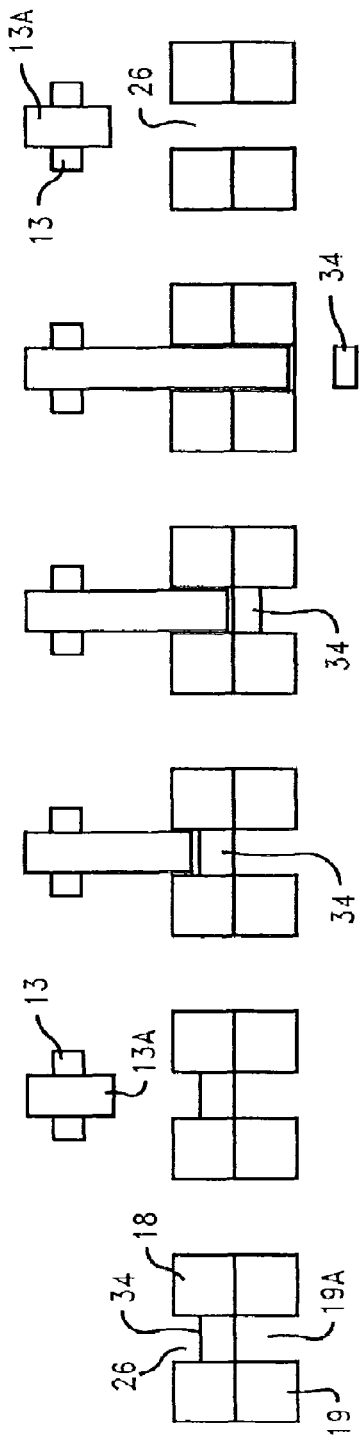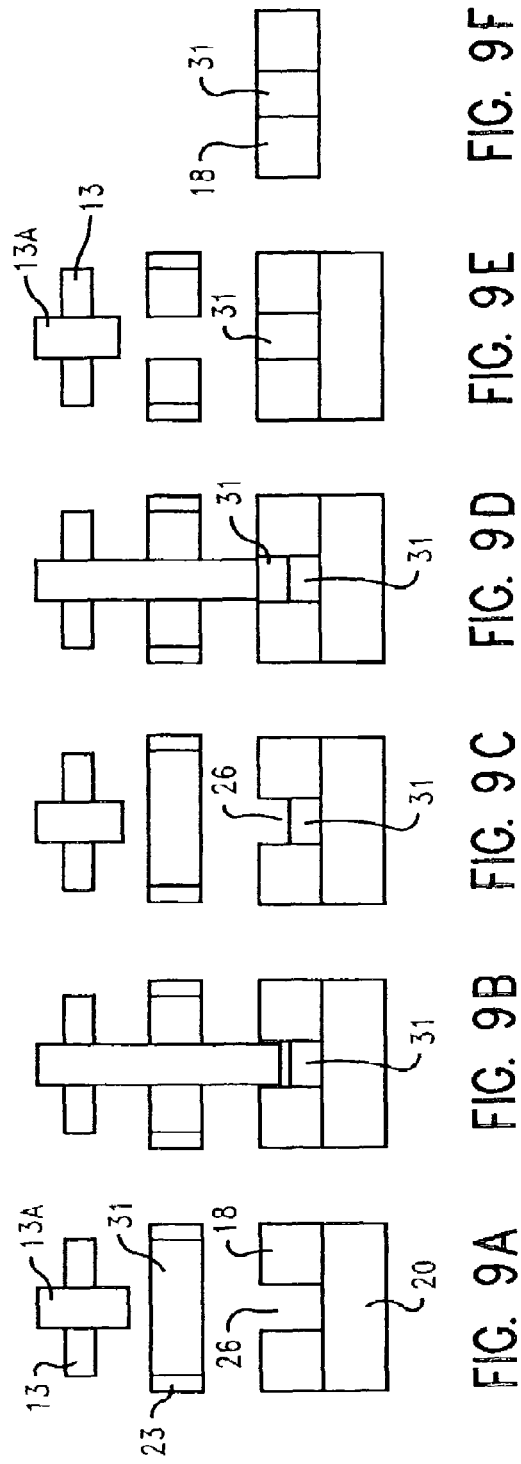

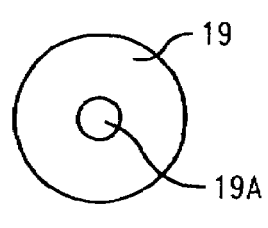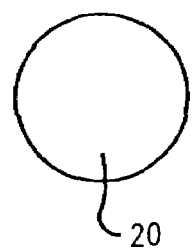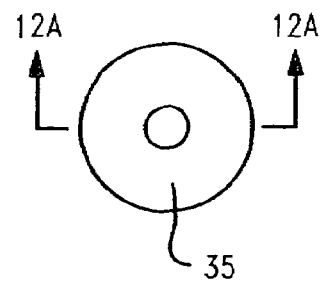
FIG. 10      FIG. 11      FIG. 12
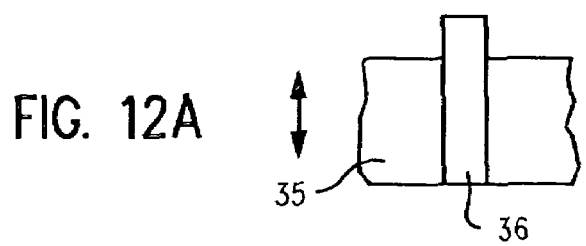
FIG. 12A
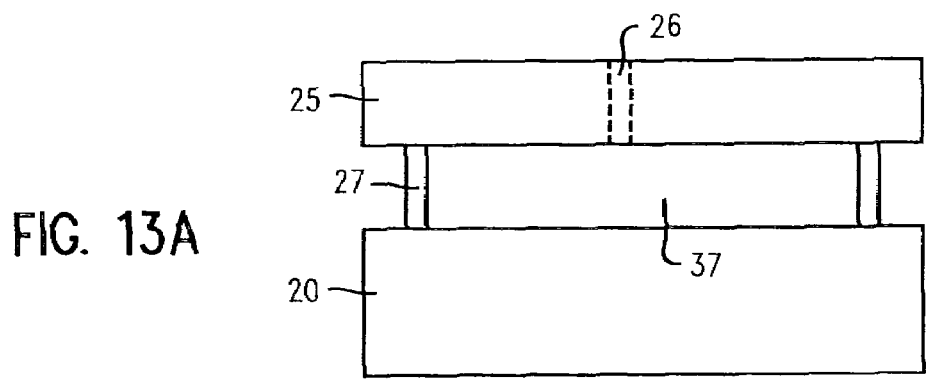
FIG. 13A
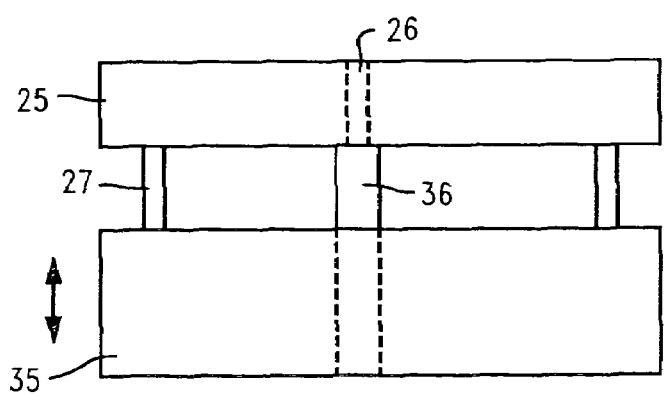
FIG. 13B

GREENSHEET VIA REPAIR/FILL TOOL

BACKGROUND OF THE INVENTION

1. Field of the Invention

This invention relates to a method and apparatus for repairing partially filled vias, defective vias, and filling empty vias within a ceramic product greensheet and, more particularly, to using a tool comprising a punch head assembly, a product greensheet assembly and a transfer greensheet assembly in which a punch head assembly locates the via to be repaired or filled, is used to move and position a transfer greensheet containing filled vias over the product greensheet and a via of the transfer greensheet is punched by the punch head of the punch head assembly to repair and/or fill the via.

2. Description of Related Art

Ceramics have found widespread use in the electronics industry as a substrate for integrated circuit packages. In general, metalized circuit patterns are applied to a ceramic substrate which is in the form of an unsintered greensheet, and a plurality of the metalized ceramic greensheets are stacked and laminated and co-sintered to create a monolith of substrate and three-dimensional metal circuitry. The ceramic greensheets are constructed by combining ceramic particles and organic binders and forming into unfired, or "greensheet," tape.

The casting of suspensions of ceramic material to form layers or greensheets which are then laminated and sintered to make a ceramic substrate electronic article is well known in the art. The doctor blade method is one method for making a ceramic greensheet and typically, ceramic powder is mixed with an organic solvent, a plasticizer and a binder forming a slurry, the slurry is cast in a regulated thickness on a carrier film with the aid of a doctor blade, and the applied layer of the slurry and carrier film is then dried. The ceramic containing formula typically uses a ceramic such as alumina and a butyral type resin like polyvinyl butyral as the binder.

Once the greensheets are formed, via holes are formed in a predefined pattern in the greensheet and the via holes then filled with a conductive paste. Metal lines in a form of circuitry connecting the vias are then formed on the surface of the greensheet by screening or extrusion printing with the conductive paste. The conductive paste is formed of a suitable particulate metallic material such as molybdenum or copper, which will withstand the subsequent sintering process. The metalized sheets are then stacked, laminated, and fired in an appropriate atmosphere to form a monolithic MLC substrate with complex internal circuitry.

Due to the ever increasing complexity of microelectronic packaging, greensheet patterns are becoming ever more difficult to fabricate defect free. With patterns containing several hundred thousand vias per greensheet, even a single unfilled or partially filled via renders the entire greensheet useless.

Bearing in mind the problems and deficiencies of the prior art, it is therefore an object of the present invention to provide a method for filling vias in a ceramic greensheet.

It is another object of the present invention to provide a method for repairing vias in a ceramic greensheet.

A further object of the invention is to provide an apparatus for filling vias in a ceramic greensheet.

It is yet another object of the present invention to provide an apparatus for repairing vias in a ceramic greensheet.

Another object of the invention is to provide a viewing system for use with the apparatus and method.

Still other objects and advantages of the invention will in part be obvious and will in part be apparent from the specification.

SUMMARY OF THE INVENTION

The above and other objects, which will be apparent to those skilled in art, are achieved in the present invention which is directed to, in a first aspect, a method for filling vias in a greensheet comprising:

securing and positioning a product greensheet having circuit patterns and one or more vias to be filled;

determining the position of the via to be filled in the product greensheet;

positioning a backing filler die under the via to be filled, the backing filler die having a solid flat surface so that the solid flat surface of the backing filler die is under and flush to the via to be filled;

positioning a transfer greensheet having a fixed array of previously filled and dried vias over the via to be filled, with one of the filled vias being positioned over the via to be filled in the product greensheet;

positioning a punch head over the via to be filled and the filled via of the transfer greensheet;

activating the punch head to punch the transfer greensheet via to fill or partially fill the product greensheet via; and repeating the above steps for all the vias to be filled in the product greensheet.

In another aspect of the invention the method comprises one or more of the following steps:

securing the product greensheet on a product greensheet vacuum plate having a central opening with vacuum ports at the periphery of the plate to hold the product greensheet, the product greensheet having vias to be filled so that the vias and circuit patterns of the product greensheet are within the central opening of the vacuum plate;

positioning the product greensheet face down on the vacuum plate with the circuit lines (patterns) of the product greensheet facing the die;

using a camera, preferably in conjunction with the punch head assembly and in a known position relative to the punch head, for locating the via to be filled and/or verifying that the via has been filled;

holding the transfer greensheet in a transfer greensheet assembly remote from the product greensheet vacuum plate which transfer greensheet assembly comprises a transfer greensheet vacuum plate preferably having an array of vacuum ports in the non-via areas of the transfer greensheet;

using a dual punch die and backing filler die with support punch which are spaced relative to each other and preferably where the backing filler die with support punch and the punch die are independently vertically moveable with the support punch sized to fit between vias and circuit lines of the product greensheet so that a flat surface is provided on the product greensheet surface during filling of the via to ensure proper filling of the via;

using a DC motor with the punch head to control the length of the punch head stroke;

using a punch head assembly comprising a flat plate on the lower surface of the assembly and surrounding the punch head with the flat plate having a plurality of vacuum ports for holding the transfer greensheet to the flat plate and the vacuum ports being aligned so that they are preferably over the non-via areas of the transfer greensheet; and using the method for repairing vias in a product greensheet by first using the punch head assembly and punch die to clean the via to be repaired of debris and then using the punch head assembly to move the transfer greensheet over the via to be filled and then punching the transfer greensheet with the punch head located above the backing filler die with support punch to fill the via.

In another aspect of the invention an apparatus tool is provided for filling vias in a product greensheet comprising:

a product greensheet assembly comprising a product greensheet plate for holding a product greensheet having vias and circuit patterns, which plate preferably has a central opening with vacuum ports around the periphery of the plate for holding the product greensheet;

a punch head assembly, preferably with a vacuum plate, for holding, moving and positioning a transfer greensheet containing vias in a fixed array, which punch head assembly will be used to punch a via of the transfer greensheet to fill the via of the product greensheet;

a transfer greensheet assembly comprising a transfer greensheet plate for holding a transfer greensheet preferably by vacuum, the transfer greensheet having a fixed array of filled vias and the transfer greensheet plate having a plurality of vacuum ports preferably spaced in the non-via areas of the transfer greensheet; and a punch die positioned in the central opening of the product greensheet plate.

In another aspect of the invention the apparatus is provided with one or more of the following comprising:

a camera used in conjunction with the punch head assembly and preferably having a fixed offset from the punch head of the assembly, for locating the via to be filled and/or verifying that the via has been properly filled;

a punch die having a flat surface for positioning under the via to be filled providing a flat surface for the filling of the product greensheet via;

a punch die which is preferably a dual die comprising a punch die and a via fill backer die with support punch that are preferably independently vertically moveable with the via fill backer support punch having a flat surface sized to fit between the via openings and/or circuit lines of the product greensheet which is having a via filled; and a DC motor used in conjunction with the punch head of the punch head assembly to control the length of the stroke of the punch head.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIGS. 8A-8F show use of the method and apparatus of the invention to clean a via in a product greensheet.

FIGS. 9A-9F show use of the method and apparatus of the invention to fill a via in a product greensheet.

FIG. 10 is a top view of a punch die.

FIG. 11 is a top view of a backing filler die.

FIG. 12 is a top view of a backing filler die with support punch of the invention.

FIG. 12A is a cross-sectional plan view of FIG. 12 taken along lines 12A-12A.

FIG. 13A shows the use of a conventional backing filler die to fill a via.

FIG. 13B shows the use of a backing filler die with support punch of the invention used to fill a via.

DESCRIPTION OF THE PREFERRED EMBODIMENT(S)

Figure 1:
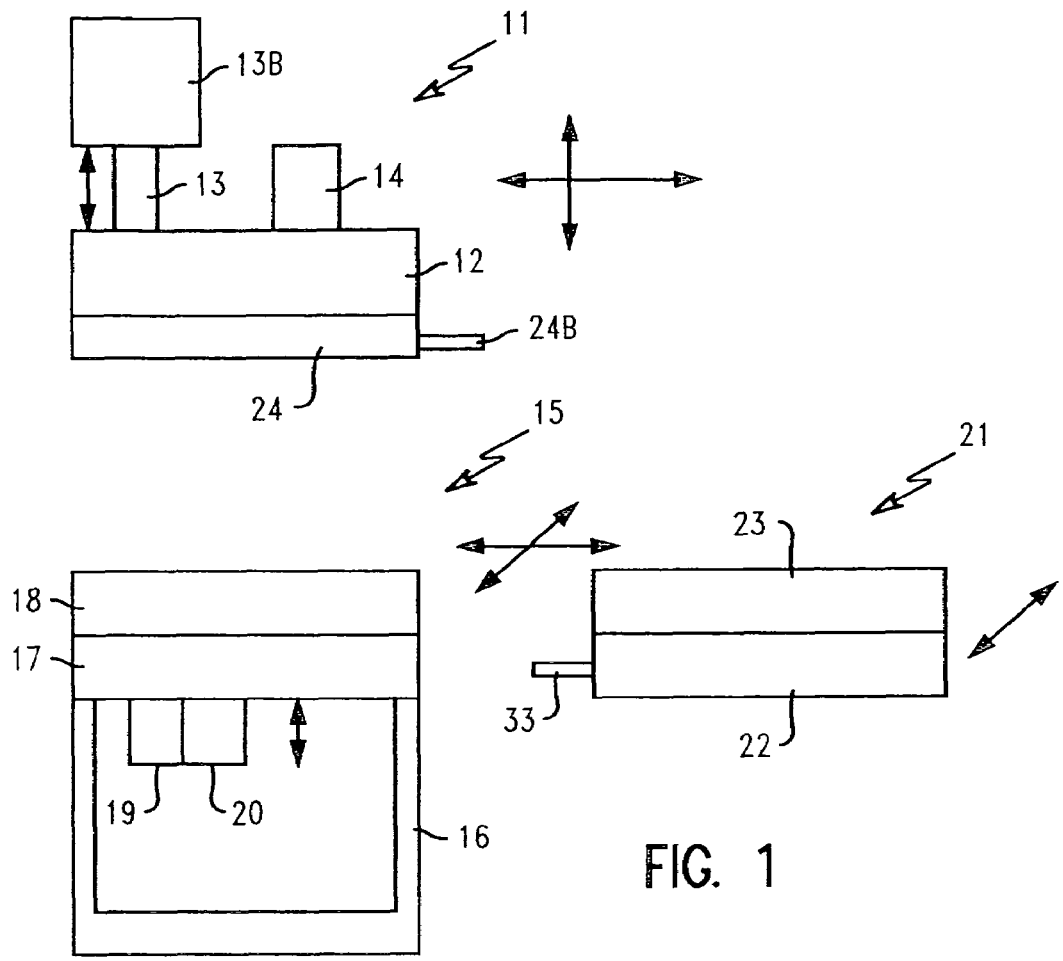
FIG. 1 is a schematic illustration of an apparatus of the invention.

In describing the preferred embodiment of the present invention, reference will be made herein to FIGS. 1-17 of the drawings in which like numerals refer to like features of the invention.

Broadly stated, an automated apparatus and method have been invented that fills and/or repairs an unfilled or partially filled via on a ceramic product greensheet typically containing circuit lines by first accurately locating a defective via or via to be filled under a punch head and corresponding lower die, punching the defective via if necessary to ensure debris within the via is removed and the via is clean, and then punching the via of a transfer greensheet containing a via into the product greensheet via with new metallic paste of the transfer greensheet via to repair or fill the via. A vision system may also be used to visually locate the via to be repaired or filled as well as verify the repair or fill was correctly performed. The apparatus comprises a punch head assembly, a product greensheet assembly, and a transfer greensheet assembly.

Punch Head Assembly

The preferred punch head assembly comprises a support, a punch head in the support, which is moveable up and down, preferably a camera at a fixed offset position to the punch head, means to actuate the punch head, a vacuum plate to hold a transfer greensheet as described hereinbelow. The punch head assembly preferably moves in X- and Z planes.

The punch head assembly preferably uses a linear dc motor to drive the punch head up and down. This enables dynamic adjustment of the stroke of the punch. The benefit of such a motor drive over a punching mechanism with a fixed stroke is that the same punch can be used for both cleaning the via out for a repair, where a long stroke is needed to ensure the cleanliness of the via, and also for the filling of the via, where the bottom position of the punch stroke needs to be set at a specific height to ensure a proper fill. Also, for via filling where multiple transfer punch steps are required to fill the via, the bottom position of the punch head stroke needs to be set differently for each successive punch transfer as the via gets packed higher and higher. This flexibility allows for successful via filling for a wide range of product greensheet thicknesses and transfer sheet thicknesses and any combination of the two.

A vision system preferably as part of the punch head assembly provides for initial registration between the vias in the transfer greensheet and the punch head. The benefit of using this type of transfer greensheet, as opposed to a continuous sheet of metallic paste, is that the same exact type of paste can be used in the transfer greensheet for the repair or fill as was used for the product greensheet. If the transfer greensheet was to be made from a continuous sheet of metallic paste, the formulation of the paste would probably need to be adjusted to accommodate this. This is not preferable. Also, using a transfer greensheet enables the use of standard operating procedures to formulate the greensheet since there is no difference in making a transfer greensheet of this kind versus punching and screening a typical product greensheet. A further benefit of this type of transfer greensheet is that when it is of the same material as the product greensheet, any contact between the two sheets will not result in contamination of the product.

Transfer Greensheet Assembly

The transfer greensheet assembly comprises a lower vacuum chuck for holding the transfer greensheet in place. The assembly preferably moves in a Y plane.

The transfer greensheet used in this apparatus comprises a greensheet (preferably the same material as the greensheet being repaired/filled) with vias that are previously filled and dried with metallic paste, preferably the same as the filled vias of the product greensheet. The vias in the transfer sheet are on a known fixed grid and are preferably larger than the vias being repaired or filled which allows for some misregistration between the punch head and the via of the transfer greensheet. The amount of acceptable misregistration is dependent on the difference in size between the punch head and the transfer greensheet via.

The punch head assembly locates and positions the transfer greensheet between the punch head assembly and the product greensheet during movement between the transfer greensheet assembly and the product greensheet assembly as well as removing the transfer greensheet during the initial punching of the product greensheet via to clean out the via being repaired (or the punching of a new via that needs to be added to an existing product greensheet). The punch head assembly comprises a vacuum head (plate) that is integral with the punching head of the punch head assembly. The vacuum head plate will hold the transfer greensheet from above and comprises vacuum chambers and preferably a thin metal mask to create accurately defined vacuum ports. These vacuum ports are preferably designed and positioned accurately with respect to the location of the punch head in the punch head assembly such that a vacuum port will preferably always fall within a "non-via" region of the transfer greensheet. This is important because as the transfer greensheet gets used and the vias within the transfer greensheet are transferred to the product greensheet, the transfer greensheet becomes perforated. If a vacuum port of the punch head apparatus were to fall on one of the vias that has already been transferred out of the transfer greensheet, it might result in a vacuum leak. If this happened repeatedly, there could be enough loss of vacuum that the upper vacuum head could no longer hold the transfer greensheet. Another detriment to this vacuum leak is during the actual filling of the via. The leak causes the vacuum to migrate through the transfer greensheet and onto the product greensheet during filling which causes the product greensheet to lift up and adhere to the transfer greensheet. It then becomes difficult to separate the product greensheet and transfer greensheet as required for further moves. The system parameters are preferably designed such that during via filling, the transfer greensheet never actually comes in contact with the product greensheet and is held slightly above the product greensheet (e.g., 5 to 50 microns). This prevents any extraneous metallic paste being transferred from the transfer greensheet to the product greensheet or damaging any pattern that may exist on the surface of the product greensheet.

The transfer greensheet assembly comprises a vacuum chuck that holds the transfer greensheet from below and is located on a linear stage moving in the Y plane that can move the transfer greensheet out of the way of the punching head mechanism. The vacuum chuck comprises a flat plate with vacuum ports located such that they preferably do not overlay with vias that have been punched out of the transfer greensheet. This single axis linear stage also indexes the transfer greensheet in one direction between successive transfers so that an unused transfer greensheet via can be located beneath the punch head.

The vacuum head, that is integral with the punch head assembly, is on a horizontal linear axis moving in the X plane that is perpendicular to the axis of travel of the transfer greensheet assembly. This allows for a two dimensional array of vias on the transfer greensheet and the ability to accurately locate any of the transfer greensheet vias beneath the punch head. The transfer greensheet is transferred from the vacuum chuck, holding the transfer sheet from below, to the vacuum head of the punch head assembly, which holds the transfer greensheet from above, by locating one above the other and switching vacuum from one to the other. Conversely, the transfer greensheet is transferred from the vacuum head back to the vacuum chuck in the same way. The location of the transfer greensheet relative to the punch head (upper vacuum head) will change as the vias being transferred from the transfer greensheet progresses through the array, but the transfer greensheet will always preferably be placed back on the vacuum chuck in the same exact location. Due to the accuracy of the stages, the location of the transfer greensheet is never lost and once an initial registration has been performed after loading of the transfer greensheet onto the vacuum chuck of the transfer greensheet assembly, further alignment is not necessary.

Product Greensheet Assembly

The product greensheet assembly comprises a vacuum plate for holding the product greensheet, the plate having a central opening with one or more dies in the opening for accommodating the punch head of the punch head assembly. The vacuum plate preferably moves in an X-Y plane and the dies preferably move in a Z plane.

Vias on patterned product greensheets can be categorized into three different types: stand-alone vias, vias connected to the end or within a screened circuit line, or vias closely surrounded by but not connected to screened circuitlines (within full dense square hatch patterns). Each type of via presents unique requirements to repair or properly fill. In each case, the metallic transfer paste must be pushed against a solid surface to densely pack the paste within the via as well as to keep the paste contained within the via. Although filling a stand-alone via is the easiest of the three types and requires a simple solid surface to pack the repair or fill paste against, the vias connected to a screened circuit line or in close proximity to a screened circuit line are much more difficult.

The product greensheet assembly preferably comprises two dies preferably mounted on posts located in fixed relation adjacent to one another and preferably independently moveable in the Z plane. The first die, the punching die, comprises a standard die preferably with a die opening slightly larger than the size of the punch head. Integrated into this die post is preferably a vacuum port to facilitate slug (via debris) removal. The punching die is used during the clean-out portion of the via repair cycle by repunching the via to ensure a clean hole free from any contamination that may have caused the defect in the first place or to punch a new via.

The second die, the backing filling die, is located preferably with a fixed offset adjacent to the punch die. The backing filling die preferably comprises a standard die, a guide bushing, and a backer punch. The backer punch typically protrudes through the top of the die a fixed amount. This amount must be greater than the line height of the circuit pattern lines on the product greensheet being repaired. The backing filling die is used as a support (backer) during the filling portion of the repair or fill. The backer punch of the die sits flush with the bottom of the product greensheet and as the metallic paste is being transferred from the transfer greensheet into the via being repaired or filled, the paste is pushed against the backer punch to ensure the paste is densely packed within the via. The size of the backer punch is chosen with the design ground rules of the product greensheet in mind. The size is chosen to be small enough so that it will not interfere with the closest possible circuit pattern lines (repairs are done with the pattern side of the product sheet facing down away from the punch head), but large enough so that it will not fit inside the hole previously punched out during the cleaning out portion of the repair. The backer punch also provides a backer surface for vias within a line and aids in preventing the repair paste from extruding past the existing screened features and causing shorts.

The reason for the protruding backer punch as opposed to a flat backer plate is due to the product greensheet already having a pattern screened on the bottom side.

The patterned side of the product greensheet is preferably facing away from the transfer sheet to allow the transfer sheet to come in close proximity to the product greensheet via for a clean transfer without touching and damaging any screened lines of the product greensheet.

The height of the lines on the product greensheet, typically 25 microns, would prevent a flat backer plate from contacting the product greensheet and would create a gap (roughly the height of the lines) between the product greensheet and backer die. This gap condition would allow the paste to flow sideways as soon as it reached the gap and prevent the via from being filled densely. The backer punch is sized to fit inside of any pattern lines on the product greensheet yet large enough to come in contact with the bottom of the product greensheet and not protrude into the previously punched hole.

The punch head assembly resides on a horizontally (X plane) traveling stage so that the punch head can be accurately located over both the punch die and the fill die with backer punch. The location of the dies adjacent to one another (in the same axis of travel as the horizontal punch head stage) allows the product greensheet to be punched and then filled by moving both the product greensheet and the punch head, the fixed offset amount between the dies. The alignment between the punch head and the punching die is preferably achieved using a vision system and the accuracy of the horizontal punch head stage maintains this alignment and also guarantees the alignment with the backer punch.

It is an important feature of the apparatus of the invention to keep the product greensheet separated from the dies below the greensheet during movement of the product greensheet. The product greensheet sits pattern side down on a vacuum chuck frame that is open on the inside to allow for the dies to access the entire active area of the product greensheet from below. Any time the product greensheet is moved, it is essential that the product greensheet be separated from these dies so that the dies don't contact the bottom of the product greensheet and cause the pattern to be damaged. This can be done in either of two ways. The first and preferred method is to maintain the height of the vacuum chuck frame fixed and be able to lower and raise the dies independently. The dies would be lowered when moving the product greensheet around laterally and would be raised as needed. The benefit of the independently moveable dies is that when punching, the backing filling die can remain lowered at a level below the bottom of the vacuum chuck frame so that the maximum reachable area of the product greensheet can be achieved. Similarly, when filling the via, the punch die can remain lowered so the same maximum reachable area can be achieved. The second method is to lift the vacuum chuck frame with the product greensheet prior to each move and then lower it to perform the punching or filling, this however, limits your reachable area of the product greensheet with one of the dies interfering with the vacuum chuck frame. The product greensheet coming into contact with the dies can damage the pattern but typically it is the sliding of the pattern while in contact with the dies that causes the damage to the pattern.

Apparatus and Method Applicability

Although the apparatus and method of the invention can repair defective vias, it also has further applicability. It can be used to fill existing empty via holes which can happen when a screening mask is defective and missing a via hole. The apparatus can also be used to make an EC change to the design and add a via to the pattern by moving to any location, first punching the new via and then filling the via. It can also be used to remove an existing via by first punching out the via and then filling with greensheet material as opposed to metallic paste.

Viewing System

The viewing system is an important preferred component of the apparatus for allowing the operator to easily determine the via to be repaired or filled as well as verify that the repair was performed successfully. It preferably has high resolution, extremely high contrast, and dark field illumination for improved contrast and depth perception, as well as be lightweight and compact since it is mounted on translation stages which are required to move rapidly. In a preferred embodiment, the viewing system comprises a modified high-resolution microscope incorporating a novel LED (light emitting diode) illumination system that saves both electrical energy, radiant heat, and weight while providing excellent illumination properties. It also incorporates an image folding assembly to correct and relay the image to an appropriate CCD camera system to reduce the overall size of the viewing system, image vibration, and associated thermal drift.

Typical microscope objectives allow for illumination by at least three methods. These are bright field, where the illumination light is directed along the same axis as the viewing path and is passed through the objective lens to be focused on the object to be viewed. Dark field illumination is where the illumination light is directed in a path surrounding the optical path of the objective, but separated from it. The light is preferably reflected by the inner surface of the objective to impinge on the object at an oblique angle relative to the viewing axis. A third method is useful only where transparent or translucent media is to be imaged and is where the light is transmitted from below the sample to be used. Bright field illumination is useful where polarization techniques are to be used but suffers from low contrast due to dispersion and reflection of the illumination light in the optical viewing path of the objective. Dark field illumination is extremely useful when surface topology is to be imaged due to the illumination light striking the object at an oblique angle, additionally, higher contrast is realized by not passing the illumination light through the viewing path.

Prior art illuminators for microscope objectives are typically high wattage tungsten/halogen bulbs of various designs housed in vented enclosures. Typical wattage of such lamps is in the range of 10 watts to upwards of 150 watts and requires a relatively large power supply/transformer arrangement and sometimes complicated electronic dimmers. Additionally, complicated optical paths including reflectors, lenses, mirrors etc. are required to direct the illumination through the microscope to the objective and ultimately to the object. These optical components add appreciable size, complexity and weight to the optical system which is of critical importance when the microscope is to be mounted on a motorized stage for the required rapid positioning.

An improved illumination device and optical configuration is described herein that resolves the above limitations of the prior art microscope utilizing dark field illumination.

Figure 14:
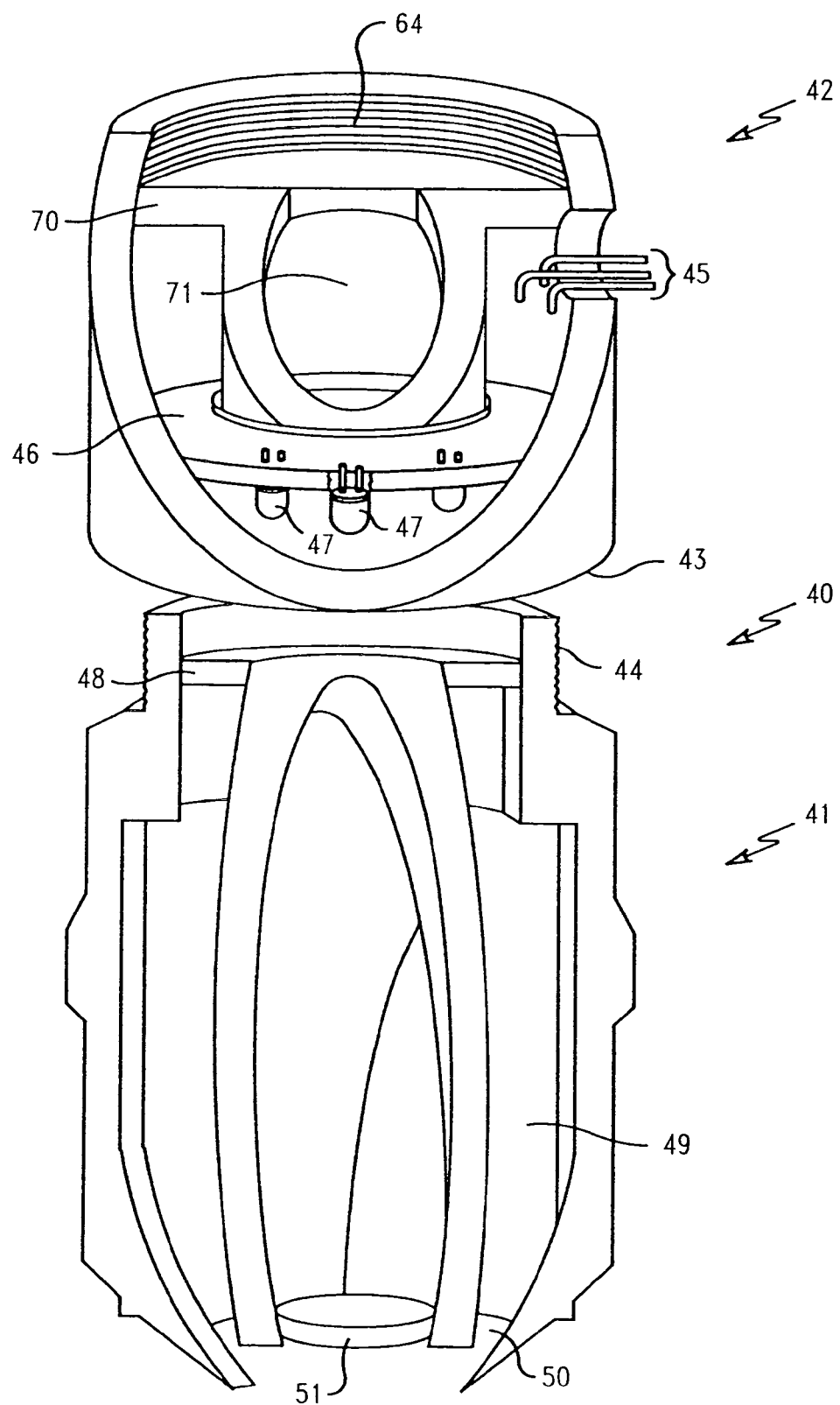
FIG. 14 shows a preferred illumination housing and optical device of the invention.
Figure 15:
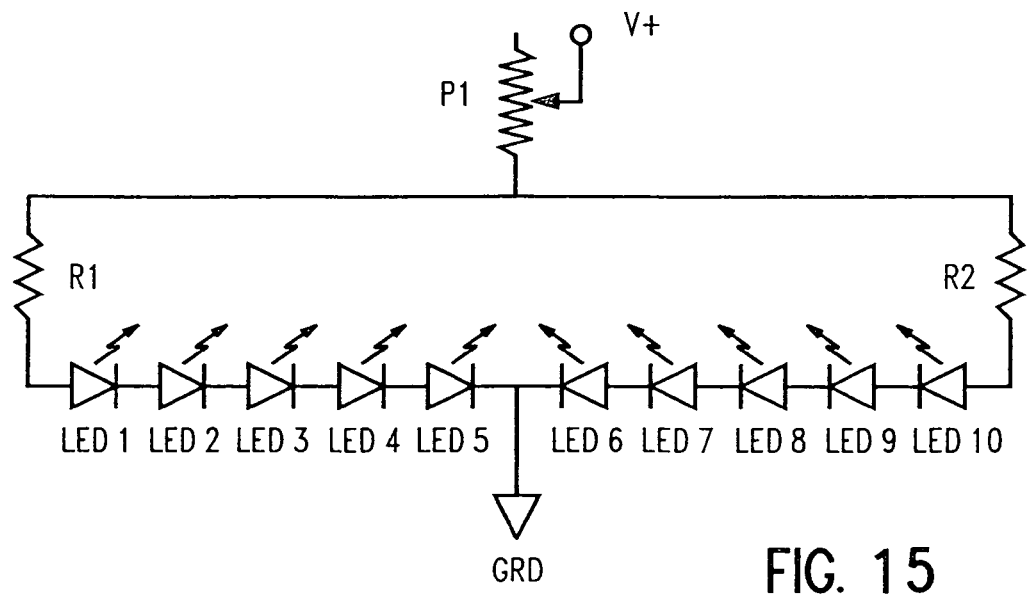
FIG. 15 shows an electrical schematic for the LED's of the illuminator housing of the device of FIG. 14.

FIG. 14 shows a sectioned view of an illuminator assembly 40 comprising a prior art objective device 41 such as a Nikon P/N 32 1 899 BD Plan 20x and a screw-on illumination housing 42 incorporating ten super-high brightness white LED's 47 such as model RL3-W3030 which can be obtained from a variety of suppliers one of which is www.superbrightleds.com.

Figure 16:
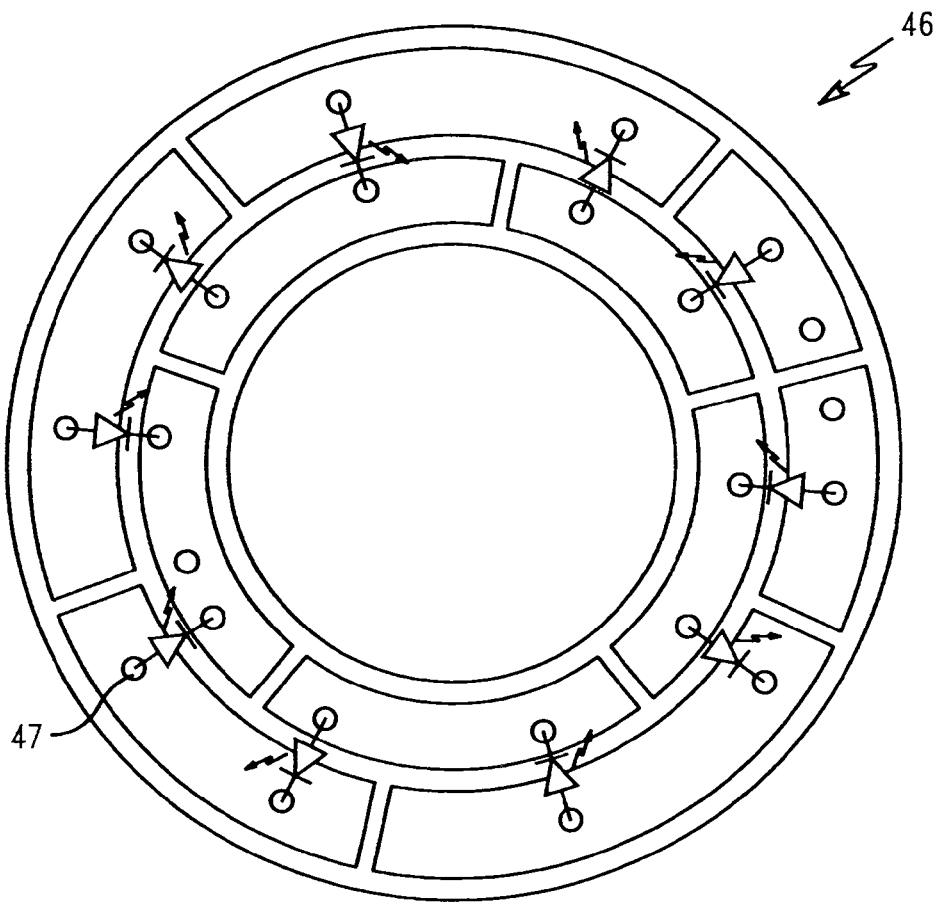
FIG. 16 shows a circuit card for the LED's used in the illuminator housing of FIG. 14.

The illuminator assembly 40 shown comprises an illuminator housing 42 which has machined threads on its lower opening 43 matching the threads 44 of the commercially available microscope objective device 41. Upper machined threads 64 are adapted to connect it to the balance of the viewing system. The illuminator housing 42 has 10 machined pockets arranged in a radial pattern sized to accept the 3 mm diameter LEDs 47 used in the preferred embodiment. The center of the radial pattern corresponds to the center of the annular dark field illumination path. The LEDs are soldered to a circuit card 46 as seen in FIG. 16 which ensures that their position corresponds to the position of the 10 machined pockets as well as provides electrical connection path for the 2 separate electrical circuits shown schematically in FIG. 15 where the potentiometer P1 in the schematic allows dimming of the LEDs. A clamp 70 with a through opening 71 holds the circuit card 16 in position.

The wires 45 connecting the LED circuits to an appropriate power supply are shown entering through a machined aperture in the side of the illuminator housing 42. Alternately, a contact assembly (not shown) integral with the illuminator housing can be used. Although 10 LEDs and 2 separate electrical circuits are used in the preferred embodiment at least one LED and circuit could be used as determined by the illumination requirements and electrical power supply provided. Alternately, power could be supplied to the LEDs by use of a battery or other DC power source which would allow the microscope illumination module to be portable.

The annular circuit card shown in FIG. 16 provides the appropriate series electrical path for the LEDs as well as a convenient method to handle the components during assembly. A schematic depiction of the LED's electrical orientation is also shown.

With the illuminator housing 42 screwed to the prior art objective device 41, the LEDs are placed proximate to the input end of the annular dark field illumination path of the objective device. The preferred objective device 41 incorporates a frosted glass diffuser 48 on its upper end, but other microscope objectives with diffusers located at various positions can also be used. In operation the electrical power is distributed to each group of five LEDs and a resistor in series. The LED's emit White light which passes through the diffuser and is reflected by the optically coated and/or highly polished dark-field illumination path 49 shown in FIG. 14 and directed out of an annular exit aperture 50 surrounding the lens 51 and onto the focal plane of the objective to provide dark field illumination of the area to be viewed. Dark field illumination is preferred to provide the maximum contrast ratio within the focal area and provides maximum image detail to determine both manual and/or machine vision verification of the proper via to be repaired or filled as well as the success of the actual repair or fill.

An alternate embodiment of the present invention would be to integrate the LEDs and associated hardware directly into the objective. The power can be supplied through an integral connection in the area of the screw mount, or alternately supplied by a battery integrated in or on the objective.

Additionally, alternate colored light could be utilized by using LED's emitting different colors, or by multicolored LEDs now commercially available.

There are numerous benefits derived from the use of the LED illumination device as described above such as low electrical power consumption, low radiant heating of the object, extremely small size, portability, extremely long lifetime of LED's vs. prior art lamps.

The prior art objectives used in the preferred embodiment are designed to be used at one object to focal plane distance of 210 mm. For commercial applications, the LED's would preferably be integrated into the lens to allow for interchangeable use in existing microscope apparatus. Alternately, especially for microscope system with interchangeable lens turrets, the illumination module could be integrated into the lens barrel of the microscope so that one led illumination module could be used for all lens magnifications.

For the preferred embodiment of the present invention, an image folding lens tube was designed both to compensate for the additional optical path length as well as reduce the overall physical length of the microscope. In a linear arrangement common to most video microscopes, this path length would be arranged in a straight line from lens to camera. In the present invention, this path length would pose numerous problems such as thermal drift and vibration especially when mounted on high precision translation stages.

Figure 17:
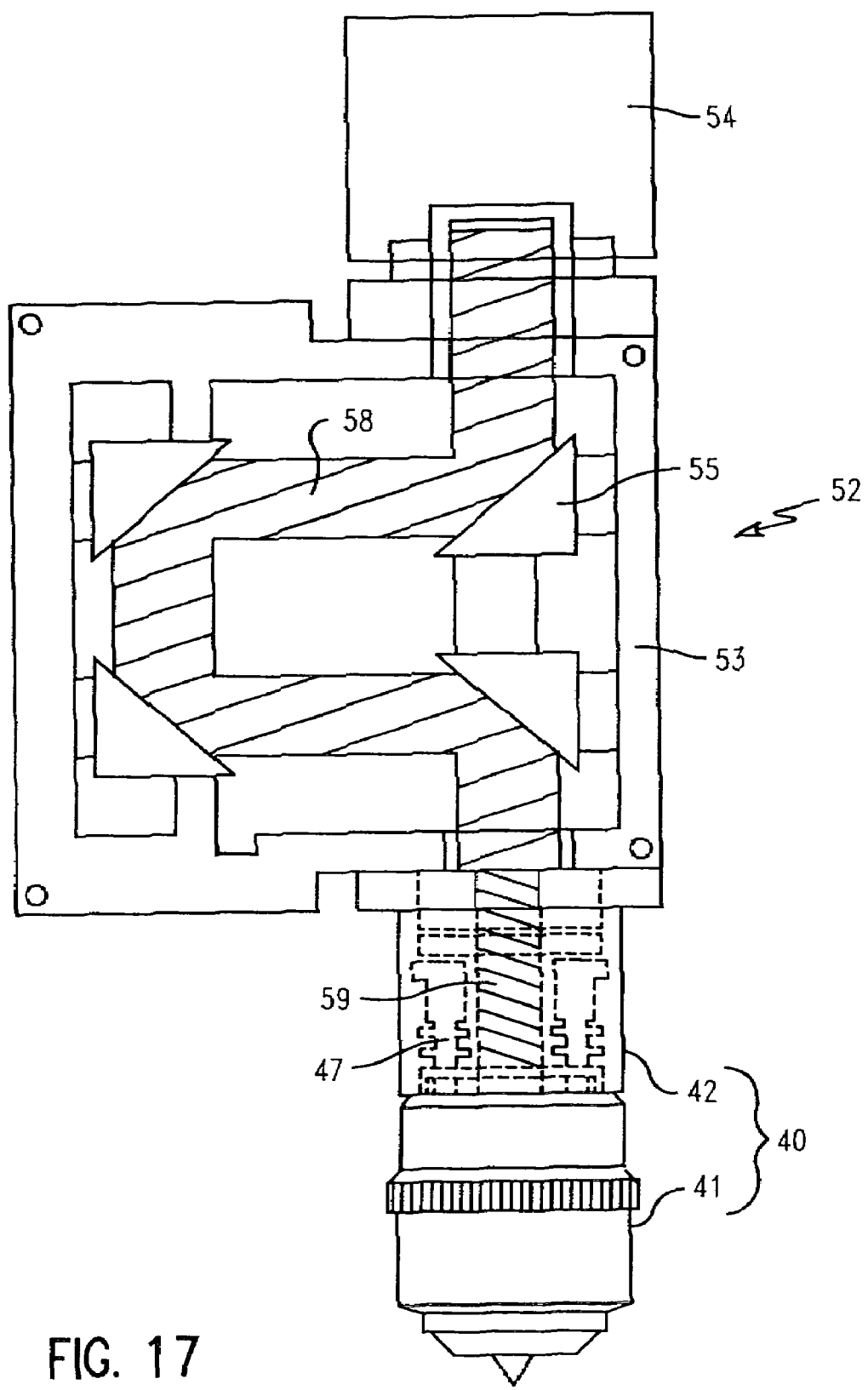
FIG. 17 is a plan, cross-sectional view of an imaging system of the invention.

FIG. 17 is a plan cross-sectional view of the image system 52 of the preferred embodiment showing the improved microscope objective device 41 and LED illuminator housing 42, an image folding apparatus 53 and a high resolution video camera 54. The optical viewing path 58 is also shown. The image folding unit provides the correct optical path length for the object to image distance and takes into account the illumination module, as well an providing for a smaller, more rigid envelope with smaller mass. This arrangement makes the microscope less susceptible to vibration. Although four right-angled prisms 55 with highly reflective aluminized surfaces on their hypotenuses are used, other prism types could be used or other optical arrangements providing the image at the camera focal plane 59 remains erect.

Referring now to FIG. 1, the apparatus of the invention is shown as numeral 10. The punch head assembly is shown as numeral 11 and comprises a punch head and camera support 12, a lower vacuum plate 24 with vacuum port 24b, a punch head 13 and motor 13B and camera 14 disposed in the support. The product greensheet assembly is shown generally as numeral 15 and comprises a product greensheet vacuum chuck 17 supported on a base 16. The chuck has a central opening for, as shown in this embodiment, a punch die 19 and a backer filler die 20. A product greensheet 18 is shown supported on product greensheet vacuum chuck 17. A transfer greensheet assembly is shown generally as numeral 21 and comprises a transfer greensheet vacuum chuck 22 and vacuum port 33. A transfer greensheet 23 is shown supported on the transfer greensheet vacuum chuck. All three assemblies preferably move relative to each other during the method of the invention as described herein.

Broadly stated, the apparatus and method of the invention for repairing and/or filling vias comprises first locating the defective via in a product greensheet under a camera of known position. The defective via is then located under a punch head 13 with a corresponding punch die 19 under the sheet and the via is re-punched. This is necessary to ensure that there is no debris in the via to prevent it from being filled properly. The debris removing punch step is not needed when filling a new via. After punching, the punch head assembly 11 is raised and the transfer greensheet assembly 21 with the transfer greensheet 23, with larger already screened and dried transfer vias 31 (shown in FIG. 5), is held by the lower vacuum plate 24 and is placed between the punch head assembly 11 and the product greensheet 18. The punch head 13 of the assembly is then activated pushing a 'slug' of paste out of the transfer greensheet and into the empty via to fill the via with paste. The backer filler die with support punch 20 would be moved below the via being filled. The advantage of using this technique to repair/fill vias is that no method currently exists to repair these defective vias. Also, for filling empty vias there is no current method of identifying and filling a single via within a product greensheet.

The apparatus of the invention comprises a product greensheet assembly comprising a holder frame having a central opening that holds the product greensheet down using a vacuum around the perimeter of the frame while allowing access to the bottom side of the greensheet within the active area for placement of a fixed die. The product greensheet holder frame 17 is mounted to stacked XY linear stages to move the sheet around such that the fixed die covers the entire active area. This fixed die (19 and/or 20) is capable of raising up and down, such that when the greensheet holder frame 17 is moving the greensheet around, the die is lowered so that it is not making contact with the product greensheet thus preventing any possible damage to the pattern on the bottom side of the product greensheet.

The apparatus also comprises a punch head assembly 11 with a punch head 13 and preferably with a variable stroke and a camera 14 with a fixed offset from the punch head. This punch head/camera combination is mounted to a stacked pair of linear stages with one axis traveling in the horizontal direction in the X plane, allowing both the punch head and camera to have access to the entire active area of the greensheet as well as enough travel to allow access to a transfer greensheet assembly 21, and the other axis traveling in the vertical (Z) direction, to raise and lower the punch head and camera. Integrated into the bottom of the punch head is a flat vacuum plate 24 for holding the transfer greensheet 23 during moving of the transfer greensheet and via filling. A separate transfer greensheet assembly 21 comprises a flat vacuum plate 22 that is mounted to a linear stage that travels in the Y plane orthogonal to the horizontal (X) axis of the stacked linear stages containing the punch head/camera combination. This arrangement allows for accessing any portion of the transfer greensheet 23.

The repair method comprises: The product greensheet 18 to be repaired is first placed on the product greensheet holder 17 and held with vacuum. The camera 14 is moved directly over the punch die 19 and the via to be repaired is located so that the defective via is held in position directly above the punch die. Because of the known fixed offset between the camera 14 and the punch head 13, the punch head can now be located above the via to be repaired and in axial alignment with the punch die below. If the inspection system determining defective vias is capable of providing exact X,Y locations of the defective via, then the apparatus can immediately locate the defective via under the punch head without the need for operator intervention. It would also be possible to integrate detection algorithms with the camera to locate the defective via from a group of vias as long as the defective via is within the field of view and then use that information to accurately locate the via under the punch head, again eliminating the need for operator intervention.

The punch head 13 is now activated using motor 13B such that the via is repunched to clean out any possible debris and prepare the via for subsequent filling. The punch die 19 preferably has an integrated vacuum for slug removal to remove any punched material from the tip of the punch. The punch head 13 is then raised using motor 13B and the punch head assembly 11 raised and moved with the punch head 13 aligned in the x direction with the proper transfer via 13 within the transfer greensheet 23 located on the transfer greensheet assembly 21. The transfer greensheet 23 is a sheet of material that has holes (vias) punched, screened, and dried with the paste to be used for repair. These screened holes are preferably larger than the vias being repaired and are arranged in a fixed array. The material can be any suitable material that doesn't adversely affect the product greensheet if it comes in contact with the product greensheet. It is preferred to use a transfer greensheet which is of the same or similar composition as the product greensheet. The transfer greensheet 23 is held in place on a flat vacuum plate 22 and its location has been learned using the camera during set-up. The transfer greensheet assembly 21 is translated to axially align the proper transfer via 31 with the punch head 13. The punch head assembly 11 is then lowered such that its integrated vacuum plate 24 comes in contact with the top surface of the transfer greensheet 23. The location of the punch head relative to the transfer greensheet assembly is such that a filled transfer greensheet via 31 is located directly under the punch head in both the X and Y directions. The vacuum is then switched from the vacuum plate 22 of the transfer greensheet assembly 21 to the vacuum plate 24 of the punch head assembly 11 allowing the transfer greensheet to be held onto the bottom of the punch head assembly. The punch head assembly, with attached transfer greensheet, is then moved and located in axial alignment above the via to be repaired. This previously punched via has since been shifted slightly in one embodiment such that the die opening is no longer below the open via. This is necessary to provide a solid backing under the via required during via fill. This can also be done by shifting the die as opposed to the product greensheet. In its preferred embodiment the use of the dual die, punch die and backer fill die with support punch, can be used as shown in FIG. 1.

With the punch head 13 and transfer greensheet 23 located over the via to be filled, the punch head is then activated to push a 'slug' of paste out of the carrier sheet and into the via to be filled. The preferred variable stroke of the punch head allows the punch tip to be stopped at the required height for proper filling. Depending on the thickness of the transfer greensheet 23 and the thickness of the product greensheet 18 being repaired, it may be necessary to do multiple fills. This is accomplished by bringing the punch head assembly 11 (with transfer greensheet) back to the transfer greensheet assembly 21, placing it back on the transfer greensheet vacuum plate 22, and then indexing the punch head over to the next available filled via and picking the transfer greensheet back up such that a new filled hole is located under the punch head tip. Also, with multiple fills, the stroke of the punch is adjusted such that during subsequent fills, the height of the punch tip in its down position is set differently.

The transfer greensheet could also be a continuous ribbon that has reel to reel advancing to make indexing of the transfer greensheet even more efficient.

After repair is complete, the camera 14 can be located over the repaired via for verification. This verification can be done manually by an operator or automatically if the above mentioned detection algorithms were integrated with the camera. The method can then be repeated for other vias within the same greensheet that need to be repaired or filled or the product greensheet can be unloaded and the next product greensheet needing repair and/or filling can be loaded. The method shown below in FIGS. 9A-9F shows a process using two fill steps.

Figure 2:
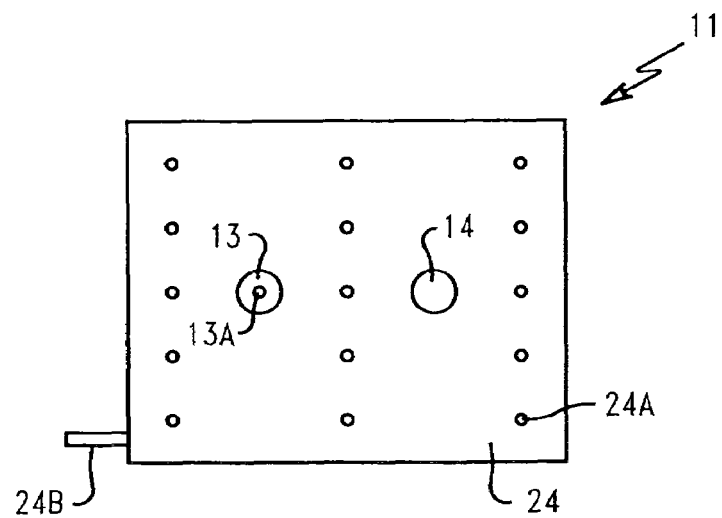
FIG. 2 is a bottom view of a preferred punch head assembly of the invention.

FIG. 2 shows a bottom view of a preferred punch head assembly 11 of the invention. The assembly 11 preferably comprises a punch head vacuum plate 24 having a plurality of vacuum ports 24A connected to vacuum line 24B. The punch head 13 is shown having a central punch head 13A. Camera 14 is shown in fixed relation to punch head 13.

Figure 3:
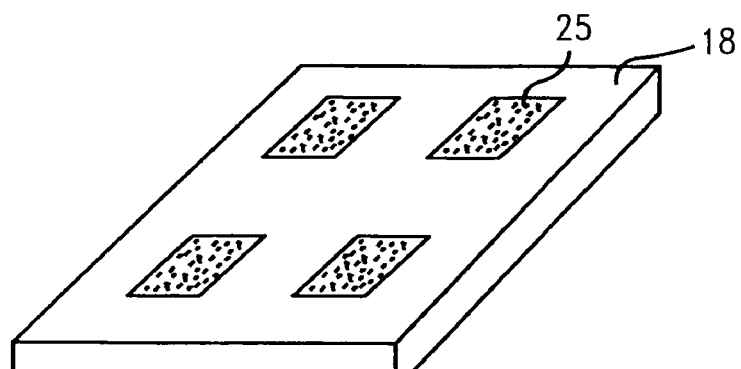
FIG. 3 is a perspective view of a product greensheet.

FIG. 3 is a perspective view of a product greensheet and typically comprised of a thin ceramic greensheet, typically 50 to 500 microns thick, in its unfired state with circuit patterns screened on it and vias extending thru the thickness of the sheet.

Figure 4:
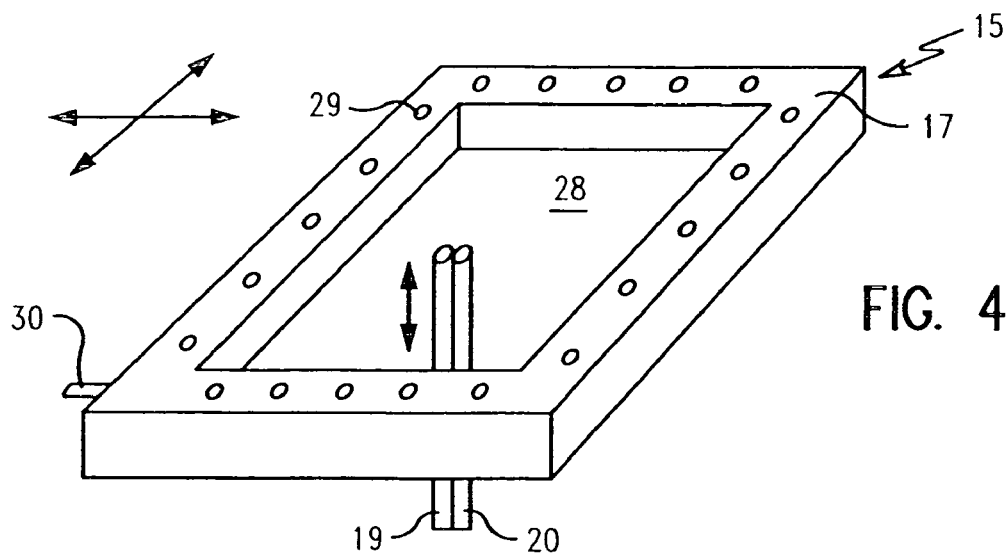
FIG. 4 is a perspective view of a preferred product greensheet assembly of the invention.

Referring now to FIG. 4, a perspective view of a preferred product greensheet assembly 15 of the invention is shown. The assembly 15 comprises a vacuum plate 17 having a central opening 28 with vacuum ports 29 around the periphery of the plate. A vacuum line 30 is connected to the vacuum ports. Punch die 19 and filler backer die 20 are shown positioned in the central opening 28.

Figure 4A:
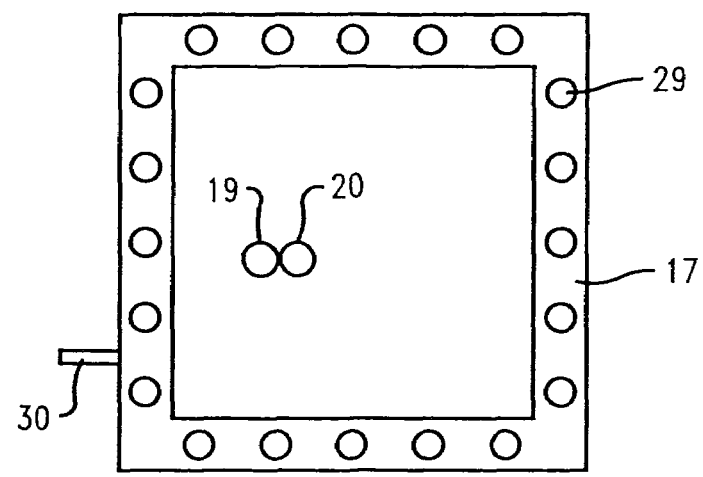
FIG. 4A is a top view of FIG. 4.

FIG. 4A is a top view of FIG. 4 and shows a product greensheet assembly.

Figure 5:
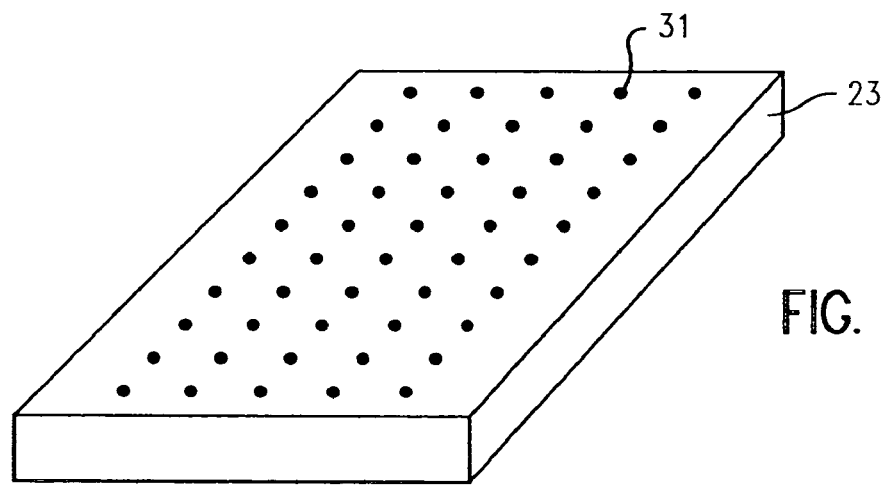
FIG. 5 is a perspective view of a transfer sheet having a plurality of filled vias In a fixed array.

Referring now to FIG. 5, this shows a perspective view of a transfer greensheet 23 of the invention having a plurality of filled vias 31 in a fixed array.

Figure 5A:
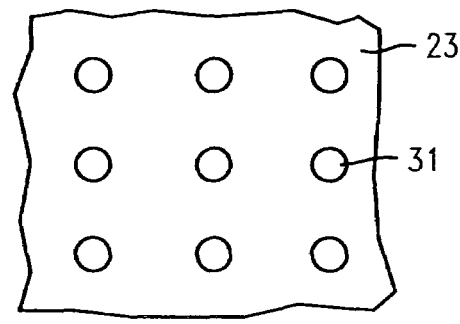
FIG. 5A is an enlarged top view of a portion of FIG. 5.

FIG. 5A is a top view of FIG. 5 and shows a transfer greensheet 23 having a plurality of filled vias 31 in a fixed array.

Figure 6:
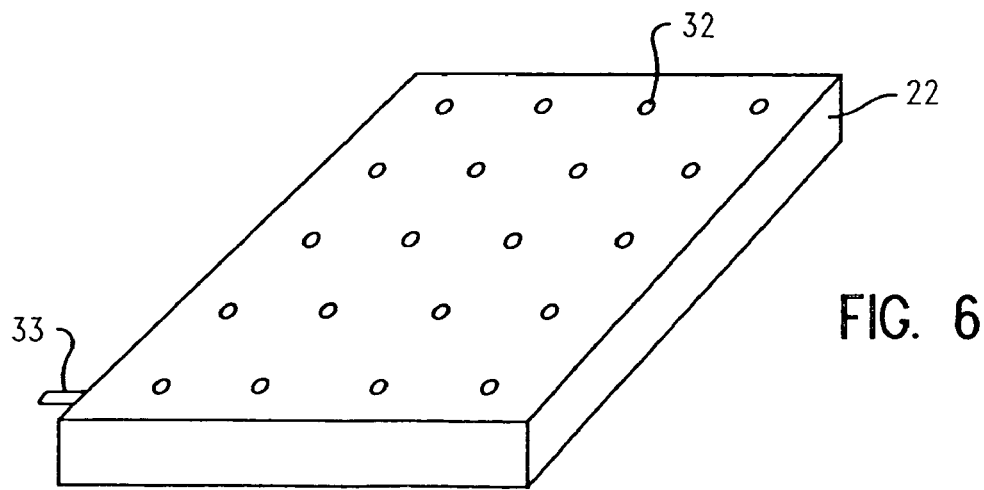
FIG. 6 is a perspective view of a transfer greensheet vacuum plate of the invention.

FIG. 6 shows a perspective view of a transfer greensheet vacuum plate 22 of the invention having a plurality of vacuum ports 32 which are connected to vacuum line 33.

Figure 6A:
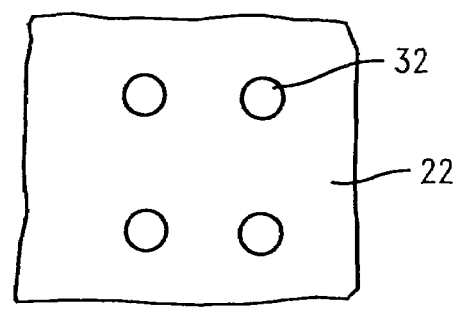
FIG. 6A is an enlarged top view of a portion of FIG. 6.
Figure 7:
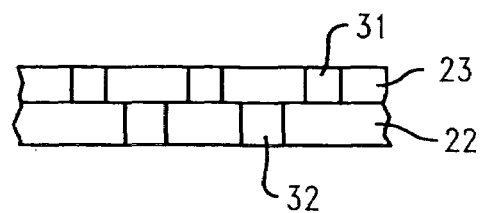
FIG. 7 is a cross-sectional plan view of a portion of a transfer greensheet positioned on a portion of a transfer greensheet vacuum plate.

In FIG. 6A, the transfer greensheet vacuum plate 22 of the invention is shown having a plurality of vacuum ports 32 also in fixed array. It is highly preferred that when the transfer greensheet 23 is placed on top of the transfer greensheet vacuum plate 22 that the vias 31 do not overlie the vacuum ports 32. This is shown in FIG. 7.

Figure 3A:
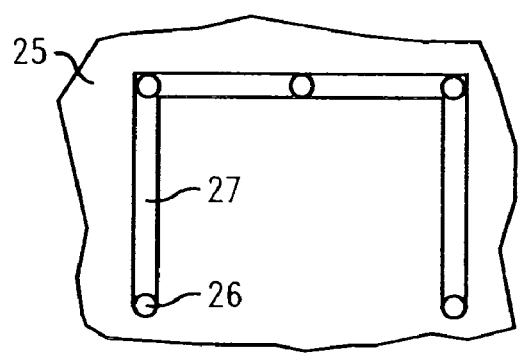
FIGS. 3A-3C are enlarged top view, plan view and side views, respectively, of a portion of the product greensheet of FIG. 3.
Figure 3B:
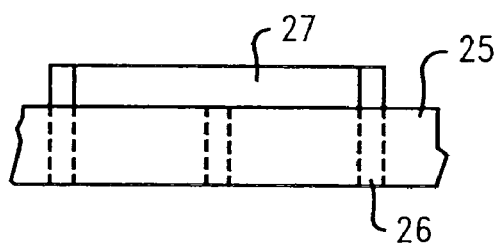
Figure 3C:
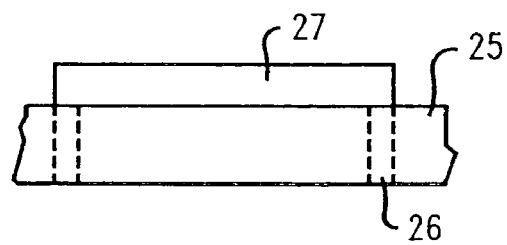

FIGS. 3A-3C show a portion of a circuit pattern on a typical product greensheet 18. Thus, vias 26 are shown connected by circuit lines 27. As seen in FIGS. 3B and 3C, the circuit lines 27 extend above the surface of the product greensheet 18 with the vias 26 extending through the thickness of the product greensheet 18. It is an important feature of the invention that a special backer filler die with support punch be used to repair and/or fill vias on product greensheets such as shown in FIGS. 3A-3C, which method can be seen hereinbelow in FIGS. 13A and 13B.

FIGS. 8A-8F show the method and apparatus of the invention to clean a via. Thus, a product greensheet 18 having a via 26 with debris 34 in the via is positioned on a punch die 19 having an opening 19A. A punch 13 with punch tip 13A is shown activated downward pushing the debris 34 out of the via into opening 19A of the die and eventually out of the die 19. In FIG. 8F, the punch tip 13A is retracted upward and cleaned via 26 is shown.

Referring now to FIG. 9A-9F, the product greensheet 18 of FIG. 8F having a clean via 26 is now filled. The via 26 is positioned over a backer filler die 20 having a support punch with flat surface and the transfer greensheet 23 with via 31 is positioned over the via opening 26 of the product greensheet. The punch tip 13A is activated pushing the via material 31 into via opening 26 partially filling via 26 of product greensheet. A second fill using a new transfer greensheet via 31 is shown completing the filling of the via (FIG. 9F). Note that the transfer greensheet via 31 is larger in diameter than product greensheet via 26. This is preferred.

FIG. 10 shows a top view of a typical punch die having a central opening 19A.

FIG. 11 is a top view of a backer filler die 20 having a flat surface and FIG. 12 shows a backer filler die 35 of the invention having a central support punch 36. This is shown further in FIG. 12A which shows the support punch 36 a fixed offset amount above the die 35.

Referring now to FIGS. 13A and 13B, use of the backer filler die 35 of the invention can be seen. Thus, in FIG. 13A the upper surface of a typical backer die 20 does not touch the lower surface of product greensheet 25 because of the height of circuit line 27. Thus, any fill of via 26 would push the via material from the transfer greensheet into opening 37 and not fill the via. In contrast, the backer fill die 35 of the invention with a central support punch 36 is positioned below the product greensheet 25 and the die and punch assembly is moved up to the bottom surface of the via so that any fill of the via 26 is now supported by the support punch 36.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method for filling vias in a greensheet comprising:

securing and positioning a product greensheet having circuit patterns and one or more vias to be filled on a product greensheet vacuum plate having a central opening with vacuum ports at the periphery of the plate to hold the product greensheet, the product greensheet having vias to be filled so that the vias and the circuit pattern of the product greensheet are within the central opening of the vacuum plate;

determining the position of the via to be filled in the product greensheet;

positioning a backing filler die under the via to be filled, the backing filler die having a solid flat surface so that the solid flat surface of the backing filler die is under and flush to the via to be filled;

positioning a transfer greensheet having a fixed array of filled vias over the via to be filled, with one of the filled vias being positioned over the via to be filled in the product greensheet;

positioning a punch head over the via to be filled and the filled via of the transfer greensheet;

activating the punch head to punch the transfer greensheet via to fill or partially fill the product greensheet via; and repeating the above steps for all the vias to be filled in the product greensheet.

2. The method of claim 1 wherein the product greensheet is held with the circuit patterns facing on the vacuum plate.

3. A method for filling vias in a greensheet comprising:
securing and positioning a product greensheet having circuit patterns and one or more vias to be filled;
determining the position of the via to be filled in the product greensheet;
positioning a punch head die and backing filler die assembly, with each die being spaced relative to each other, under the product greensheet;
positioning the backing filler die under the via to be filled, the backing filler die having a solid flat surface so that the solid flat surface of the backing filler die is under the via to be filled and the backing filler die has a support punch protruding a fixed offset above the backing filler die which is sized to fit between the vias and circuit patterns of the product greensheet;
positioning a transfer greensheet having a fixed array of filled vias over the via to be filled, with one of the filled vias being positioned over the via to be filled in the product greensheet;
positioning a punch head over the via to be filled and the filled via of the transfer greensheet;
activating the punch head to punch the transfer greensheet via to fill or partially fill the product greensheet via; and
repeating the above steps for all the vias to be filled in the product greensheet.

4. A method for filling vias in a greensheet comprising:
securing and positioning a product greensheet having circuit patterns and one or more vias to be filled;
determining the position of the via to be filled in the product greensheet;
positioning a backing filler die under the via to be filled, the backing filler die having a solid flat surface so that the solid flat surface of the backing filler die is under and flush to the via to be filled;
positioning a transfer greensheet having a fixed array of filled vias over the via to be filled, with one of the filled vias being positioned over the via to be filled in the product greensheet wherein the transfer greensheet is positioned using a punch head assembly comprising a flat plate on the lower surface of the assembly and surrounding the punch head with the flat plate having a plurality of vacuum ports holding the flat plate to the transfer greensheet and the vacuum ports being aligned so that they are over the non-via areas of the transfer greensheet;
positioning a punch head over the via to be filled and the filled via of the transfer greensheet;
activating the punch head to punch the transfer greensheet via to fill or partially fill the product greensheet via; and
repeating the above steps for all the vias to be filled in the product greensheet.

\* \* \* \* \*